United States Patent [19]

Wright et al.

[11] Patent Number: 4,607,761

[45] Date of Patent: Aug. 26, 1986

[54] APPARATUS FOR DISPENSING SOLID COMPONENTS FROM A FLEXIBLE SUBSTRATE ASSEMBLY

[75] Inventors: Steven F. Wright, Glen Ellyn; Joseph E. McGurk, Stickney, both of Ill.

[73] Assignee: Molex Incorporated, Lisle, Ill.

[21] Appl. No.: 703,250

[22] Filed: Feb. 20, 1985

Related U.S. Application Data

[63] Continuation-in-part of Ser. No. 597,637, Apr. 6, 1984.

[51] Int. Cl.⁴ .............................................. G07F 11/66
[52] U.S. Cl. ........................................ 221/25; 221/73; 221/311; 221/312 R; 206/346
[58] Field of Search ................. 221/25, 73, 72, 71, 221/70, 69, 74, 311, 312 R-312 C; 206/345, 346, 347; 414/223

[56] References Cited
U.S. PATENT DOCUMENTS 3,048,268 8/1962 Rocchi et al. ................... 221/72
3,482,733 12/1969 Groves .......................... 221/25

Primary Examiner—Joseph J. Rolla
Assistant Examiner—David H. Bollinger
Attorney, Agent, or Firm—Louis A. Hecht

[57] ABSTRACT

Disclosed is an improved for dispensing solid members, such as electrical connectors, having extended rigid projections inserted in a penetrable flexible substrate sheet material. The apparatus for dispensing the solid members includes a rotatable drum having a solid surface. The sheet material containing the solid members is pulled across the drum surface by a frictional drive roller, thereby pulling the sheet material radially inwardly past the solid projections, creating a gap between the solid members and the sheet material. Wedge-like finger members are inserted in the gap, to complete removal of solid projections from the sheet material, thereby releasing the solid members for slideable movement along the finger members to a remote work station.

3 Claims, 8 Drawing Figures

APPARATUS FOR DISPENSING SOLID COMPONENTS FROM A FLEXIBLE SUBSTRATE ASSEMBLY

This is a continuation-in-part of U.S. patent application Ser. No. 597,637 filed Apr. 6, 1984, and assigned to the assignee of the present invention.

BACKGROUND OF THE INVENTION

1. Field of the Invention

The present invention is directed to the dispensing of solid members having extended rigid projections, particularly electrical connectors, which are packaged in a flexible substrate assembly by inserting the extending projections into a surface of a continous flexible support sheet. which is folded in a boustrophedon pattern, or wound about a reel.

2. Discussion of the Prior Art

Electrical connectors are mass produced by positioning on insulative housing, generally a plastic rectangularly shaped member, automatically at various locations along an assembly line for pin insertion and other machine accomplished steps until the electrical connector is in its final manufactured form. Once the electrical connector is completed, the connectors are automatically conveyed to a completed connector hopper positioned to receive the connectors from a conveyor so that the completed connectors fall one by one into the hopper where they fall upon each other. The completed connectors falling upon each other sometimes cause damage to the extending pins or conductors such as by causing some of the plated-on highly conductive metal to be scraped away from the conductors or pins or by bending the pins.

The connectors are manually removed from the hopper, one by one, inspected and manually packaged. Packaging the connectors can be done in bulk by filling a plastic bag or other suitable container with anumber of connectors in contact with each other in a random manner, but bulk packaging generally is unsuitable because many of the connectors are damaged during transport. Another more time consuming and expensive method of packaging connectors has been by manually aligning the connectors in layers in a suitable container, such as a cardboard box, to minimize the connector contact during storage. A layer of compressible material sometimes is disposed between each layer of hand packed connectors to minimize the damage to the connectors during transport.

Recently, the assignee of this application has packaged connectors by aligning the connectors longitudinally in plastic tubes so that the connectors come into contact with each other only at plastic housing ends so that the conductors or pins extending from the connector housings do not contact each other during transport. However, this is a relatively expensive method of packaging, and requires that the plastic tubes have a cross sectional configuration corresponding to that of the connectors contained therein.

The assignee of the present invention has therefore developed yet another packaging system in which the extending rigid projections are inserted into a flexible sheet material which is provided as a continuous web. This packaging assembly, described in assignee's U.S. patent application Ser. No. 597,637 filed Apr. 6, 1984 provides a packaging technique which is readily adapted to connectors and other articles of manufacture of varying sizes. The flexible substrate, having a plurality of connectors retained thereon, can be disposed in a stacked array in a shipping carton, or may be wound about a shipping reel to provide dense, highly efficient packaging arrangement. There is a need, however, to provide an efficient apparatus for dispensing components contained on the flexible substrate, in a manner which is compatible with current mass production equipment. In particular, the components must be dispensed from the substrate assembly at a rate which meets the throughput of todays mass terminating equipment. Also, a technique for dispensing the components, which preserves their orientation when loaded into the flexible substrate, is also required.

SUMMARY OF THE INVENTION

Accordingly, an object of the present invention is to provide an apparatus for dispensing a plurality of solid members, having extending rigid projections, which are removably retained onto a flexible sheet material.

Yet another object of the present invention is to provide an apparatus for disposing a solid member at a predetermined disposition relative to a work station.

Another object of the present invention is to provide an apparatus for disposing a continuous web carrying electrical connectors at a predetermined disposition relative to a work station and moving the continuous web in steps to dispose a single connector at the work station with each step of web movement.

In accordance with the present invention, an improved apparatus is provided for sequentially disposing a plurality of solid members, one at a time, at a predetermined disposition relative to a work station comprising a substrate assembly, including a plurality of solid members removeably retained in a flexible sheet material, said solid members having extending rigid projections inserted into said flexible sheet material;

a sheet material supporting means positioned adjacent said substrate assembly, said supporting means having a first solid portion disposed at said work station; and said substrate assembly disposed to overlie the sheet material supporting means to dispose a first solid member at a predetermined position on the supporting means.

The improvement comprises:

means for at least partially separating said solid member from said flexible substrate to create a gap therebetween; and at least one wedge-like lifting member disposed adjacent said support roller surface and extending in the direction of said sheet material, said lifting member positioned to lie adjacent said rigid projections, and having a free end for insertion in the gap between said sheet material and said solid members.

BRIEF DESCRIPTION OF THE DRAWINGS

The above and other objects and advantages of the present invention will become apparent with reference to the drawings wherein.

DETAILED DESCRIPTION OF THE PREFERRED EMBODIMENTS

Figure 1:
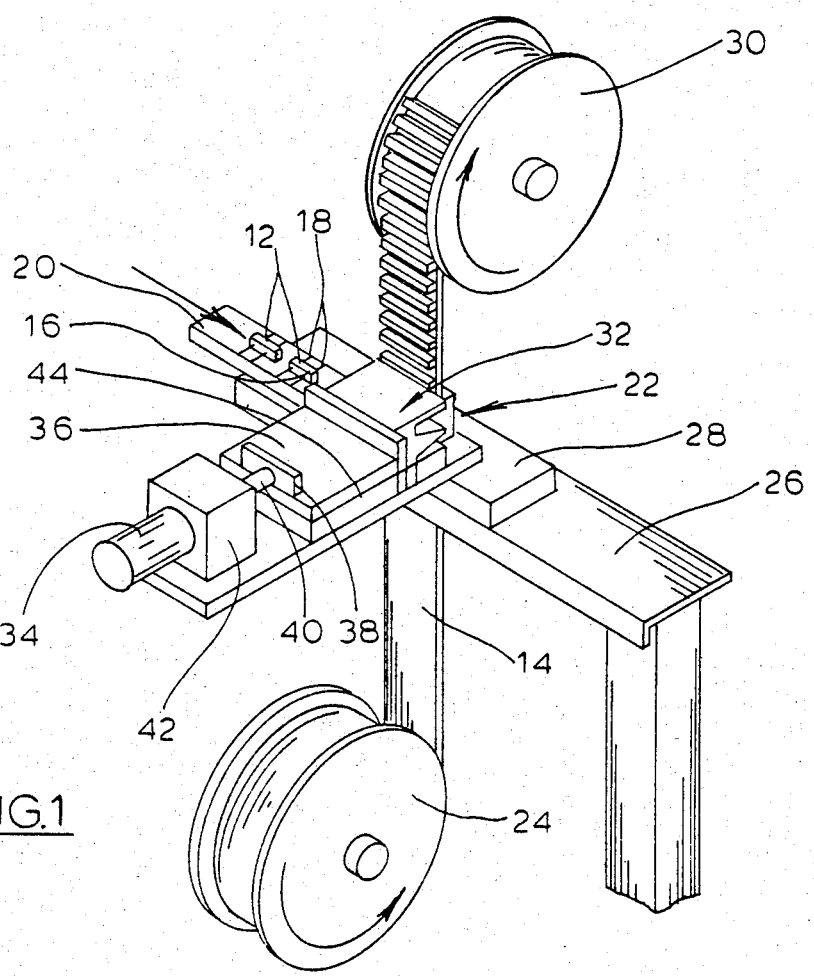
FIG. 1 is a perspective view of a method and apparatus for inserting electrical connectors into a flexible sheet material.

Turning now to the drawings and initially to FIG. 1, there is illustrated a plurality of electrical connectors 12 inserted into a sheet or web of flexible polymeric material 14. As will be explained herein, the present invention is directed to an apparatus for dispensing the electrical connectors 12 from the flexible substrate of material 14. The description of the flexible substrate packaging assembly given in U.S. patent application Ser. No. 597,637, filed Apr. 6, 1984, and assigned to the assignee of the present invention, is incorporated by reference herein. A brief description of the substrate is, however, included herein.

The electrical connectors 12 include an insulative housing 16 having a plurality of electrically conductive pins 18 extending from the housing 16. The present invention is equally applicable, however, to any solid member having rigid projections extending therefrom, such as other electrical circuit members. As shown in FIG. 1, completed electrical connectors 12 are conveyed along a conveyor platform 20 in single file longitudinal alignment to an insertion station, generally designated 22. En route to the insertion station 22, for example along the connector conveyor platform 20, the connectors 12 can be manually or mechanically inspected for conductor damage, for example by laser or sonic inspection prior to insertion into the polymeric sheet material 14.

The sheet or web of flexible polymeric material 14 is supplied at the insertion station 22 from a sheet material supply roll 24 and passes vertically upwardly through conveyor support platform 26 and conveyor support bar 28. The completed connectors 12 conveyed along the completed connector conveyor platform 20 are conveyed to the insertion station 22 in alignment, one at a time, with the continuous sheet or web of flexible polymeric material 14 where each completed connector 12 is sequentially inserted into the sheet material 14. The completed connectors 12 are conveyed to the insertion station 22 in alignment with the sheet material 14 such that a plurality of electrically conductive pins 18 extending from the connector insulative housings 16 are disposed substantially perpendicular to a surface of the polymeric sheet material 14, as shown in FIG. 1. A packaged connector take up reel 30 is disposed above the insertion station 22 and is automatically rotated at a predetermined speed by a suitable motor (not shown) to wind the packaged connectors 12 retained on the flexible support sheet 14 onto the reel 30 at a predetermined transverse spacing between longitudinally parallel connectors 12.

In accordance with an important feature of the present invention, the flexible support material 14 must be non-rigid. It has been found that non-rigid support sheets 14 are able to grasp inserted rigid projections, such as connector pins 18, relatively tightly. Further, the holes or apertures made by the pins 18 upon insertion into the flexible sheet material 14 do not enlarge when the flexible material and inserted connectors are moved or vibrated during transport because of the pliable nature of flexible sheet or foam materials. Rigid materials, such as rigid foam material, will permanently distort to enlarge pin receiving apertures if force is applied by inserted pins against the rigid foam material surrounding and defining the pin receiving apertures. Rigid material capable of pin-receiving aperture enlargement during transport is not suitable as a connector packaging support material since a great many of the connectors would separate from the support material during transport.

Any flexible or semi-rigid but pliable tape, sheet or web of polymeric material in solid or foam form are suitable as the flexible support material 14 so long as the sheets or webs 14 are non-rigid and capable of being punctured by the extending rigid conductors or pins 18 of a connector 12. Foam material having a thickness of about 1/16 inch provides effective retention of the connectors 12 while not occupying excessive packaging space. The sheet material should not be so thick that penetration of pins 18 will cause the pins 18 to bend. The flexible sheets or webs 14 useful can have a relatively dense and rigid surface skin so long as the flexible sheet 14 is non-rigid at its center or core since the core of the flexible sheet material 14 will remain pliable to grasp and retain inserted pins 18.

Flexible foam materials are particularly well adapted for retaining inserted pins 18 particularly the closed cell foams or partly open cell foams. Flexible foam support materials 14 include multiple spaced films of polymeric material capable of grasping the inserted pins 18 at spaced locations to provide good retention of the connector on the flexible material, yet allowing the connector 12 to be removed with a relatively small force perpendicular to the surface of the foam sheet material. The closed cell and partly open cell foams will provide more resistance to penetration of pins 18 resulting from increased pressure within the closed cells as the pins 18 attempt to penetrate the closed cells. This increased resistance causes the polymeric cell material to stretch somewhat to provide more gripping polymeric material in the immediate area of pin penetration to grip the pins 18 more tightly once penetration occurs. The open cell foams also provide a polymeric material stretching advantage to provide for greater retention but to a lesser extent. Rigid foams such as rigid epoxys and rigid polyesters are not suitable as the support sheet 14 since the pin receiving apertures will enlarge during transport and many of the connectors 12 will separate from the foam material.

Referring again to the drawings, the insertion station, generally designated 22, includes a connector insertion bar, generally designated 32, operatively connected to hydraulic cylinder 34. The connector insertion bar 32 is operatively connected to the hydraulic cylinder 34 through insertion bar slide plate 36, hydraulic cylinder piston support bar 38 and hydraulic cylinder piston 40.

The hydraulic cylinder piston 40 is operatively connected to the hydraulic cylinder 34 through an annular alignment aperture (not shown) in hydraulic cylinder support block 42. As shown in FIG. 1, the connector insertion bar 32 and the insertion bar slide plate 36 slide toward and away from the polymeric sheet material 14 on support plate 44 for insertion of the extending pins 18 of completed connectors 12 into the surface of the flexible polymeric sheet material 14.

Figure 2:
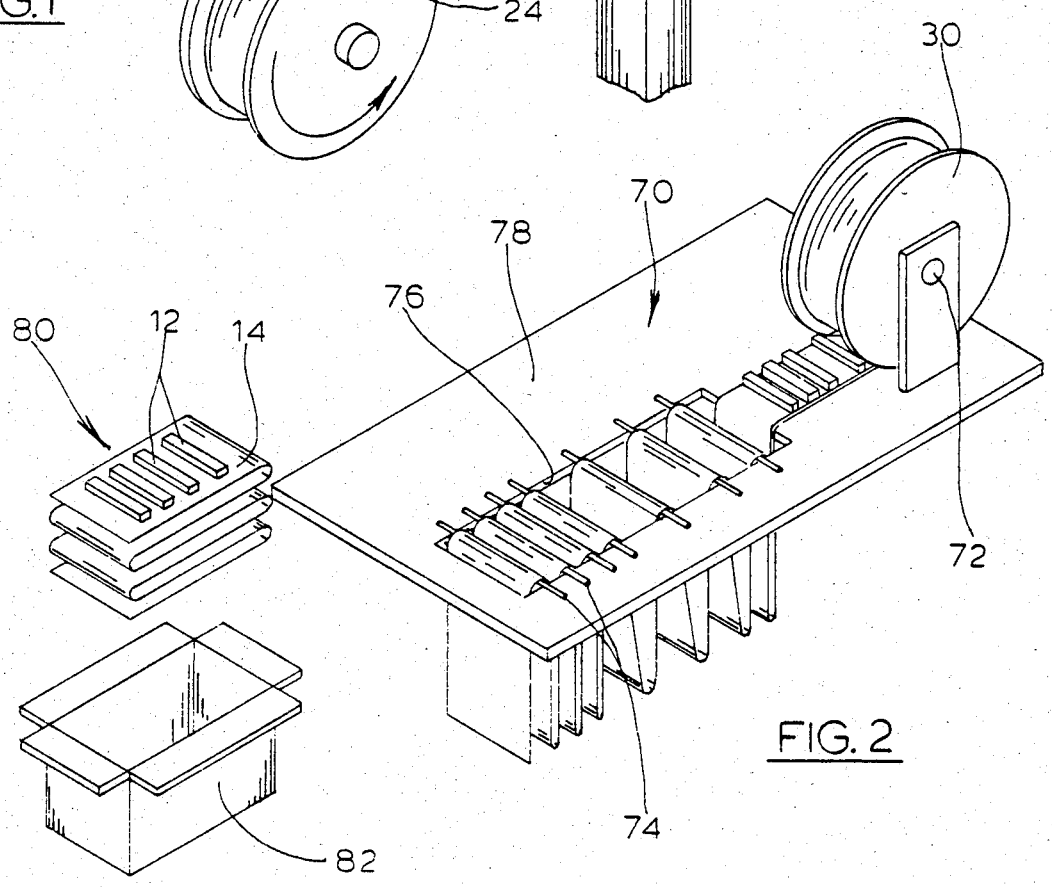
FIG. 2 is a perspective view showing the flexible substrate and inserted connectors being festooned or folded to package a continuous web of substrate and retained connectors in rectangular form for transport.

Referring now to FIG. 2, the completed, substrate assembly is wound onto take-up reel 30. The packaged connectors 12 inserted into the flexible polymeric material 14 on take up reel 30 can be re-packaged in different form at a folding station generally designated 70. At folding station 70, the take-up reel 30 can be disposed on a removable reel axis 72 so that the plurality of connectors 12 and the flexible polymeric sheet material 14 can be draped over movable fold pins 74 disposed to overlie a rectangular slot 76 in folding station plate 78. The movable fold pins 74 can be moved away from the reel 30 after the material is draped over the festoon pin 74 at regular time intervals to fold the substrate assembly upon itself in a boustrophedon pattern, as 12 retained in the flexible sheet, generally designated 80 in FIG. 2. As shown in FIG. 2, the stacked array of festooned packaged connectors 12 on flexible sheet material 14 can be suitably packaged in a container, such as rectangular cardboard box 82. For this purpose, the substrate is folded so that each layer has a length approximately equal to the length of the cards and box 82.

In accordance with the present invention, the roller support structure 86 and sheet material support lip 96 include a sheet material hold-down spring 88 to stabilize the polymeric material 14 against movement away from the roller 84 during removal of a connector 12 from the polymeric material 14. The hold-down spring 88 generally comprises a U-shaped wire member 90 integral with coil spring 92 to bias the U-shaped wire member 90 against the polymeric sheet material 14 in a direction toward the hopper 86 to hold the polymeric sheet material 14 against the hopper during removal of a connector 12 from the polymeric sheet material 14. As shown in FIG. 4, the roller 84 can be suitably attached to a package 94 such as a rectangular cardboard box for removal of a stacked array of the substrate assembly in a boustrophedon pattern. The packaged connectors 12 retained on the flexible sheet material 14 (see FIGS. 3 and 4) can be disposed at a predetermined disposition relative to a work station by positioning the flexible substrate assembly over a roller 84 or an L-shaped assembly support lip 96 connected to a suitable substrate assembly container, e.g. a plastic or carboard hopper 86 (FIG. 4) or 98 (FIG. 5), so that each individual connector 12 can be sequentially disposed at a predetermined location or work station in an exposed manner overlying the roller 84, or sheet material support lip 96, for individual removal from the polymeric sheet material 14.

Figure 5:
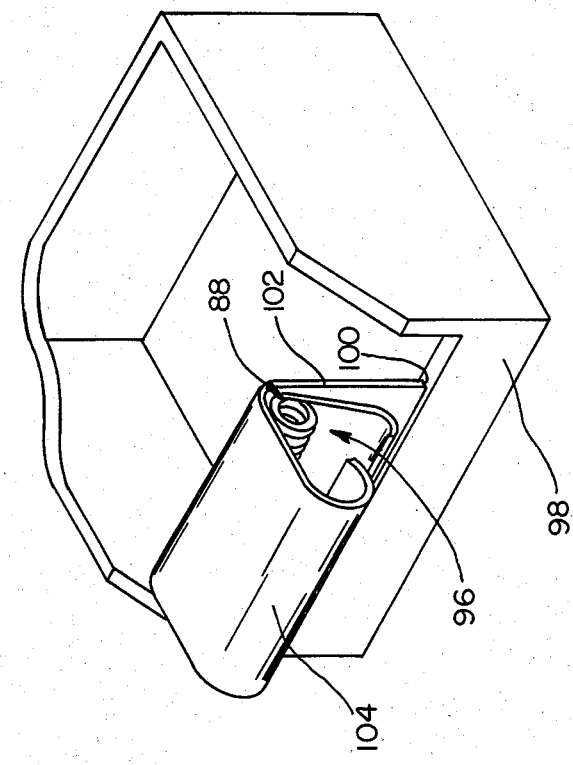
FIG. 5 is a perspective view of a sheet material support platform and sheet material hold-down spring attached to a sheet material container, constructed in accordance with the principles of the present invention.

The assembly support lip or platform 96 is L-shaped including a vertical arm portion 102 and a perpendicular, integral leg or lip portion 104. The assembly support lip 96 is retained in a slot 100 in the hopper 98, as shown in FIG. 5. A substrate assembly retained in the hopper 98 is draped over the extending leg portion 104 to position a connector at a predetermined location on the lip 96. The substrate assembly is moved with respect to the lip 96 after removal of each connector 12, to position another connector 12 at the proper location on the lip 96. In this manner, each individual connector 12 can be removed automatically, such as by a robot arm, and the polymeric sheet material can be moved downwardly, as shown in FIG. 3, to position a next adjacent connector 12 sequentially at a predetermined disposition with respect to the work station for automatic removal by a robot arm, for example.

Figure 3:
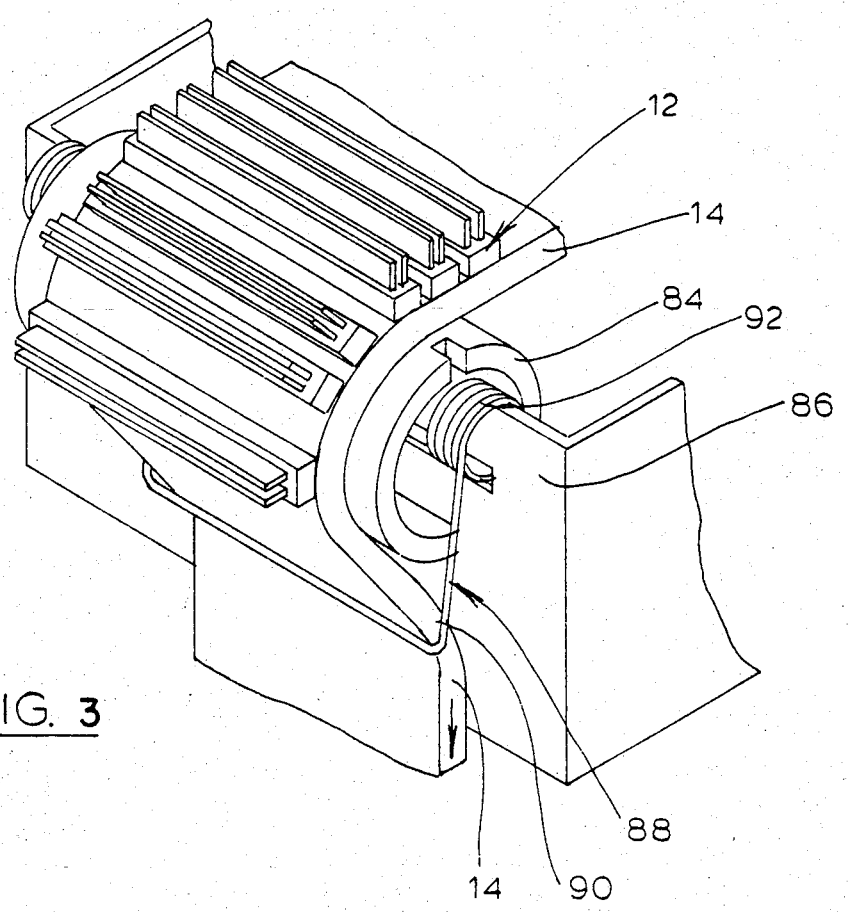
FIG. 3 is an enlarged partially broken away perspective view of the apparatus of the present invention showing a flexible sheet support roller and sheet hold-down spring for disposing connectors, one at a time, at a work station.
Figure 4:
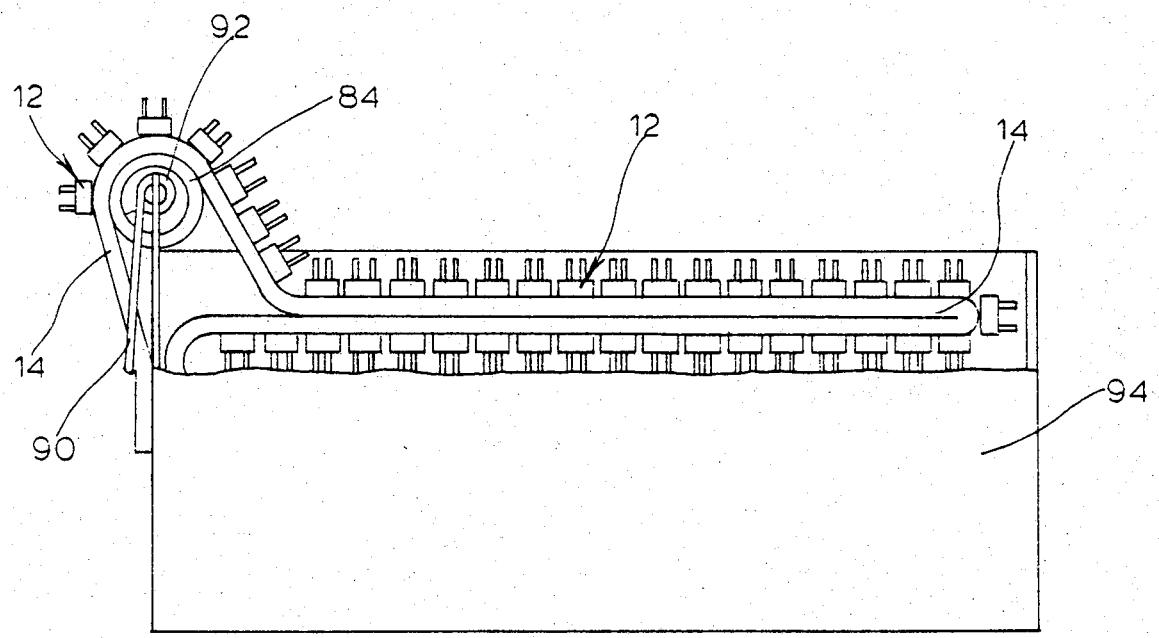
FIG. 4 is a partially broken away side view of the apparatus of FIG. 3 showing the disposition of an electrical connector at a work station from a packaged continuous web of flexible sheet material and inserted connectors, packaged in festooned or folded form.
Figure 6:
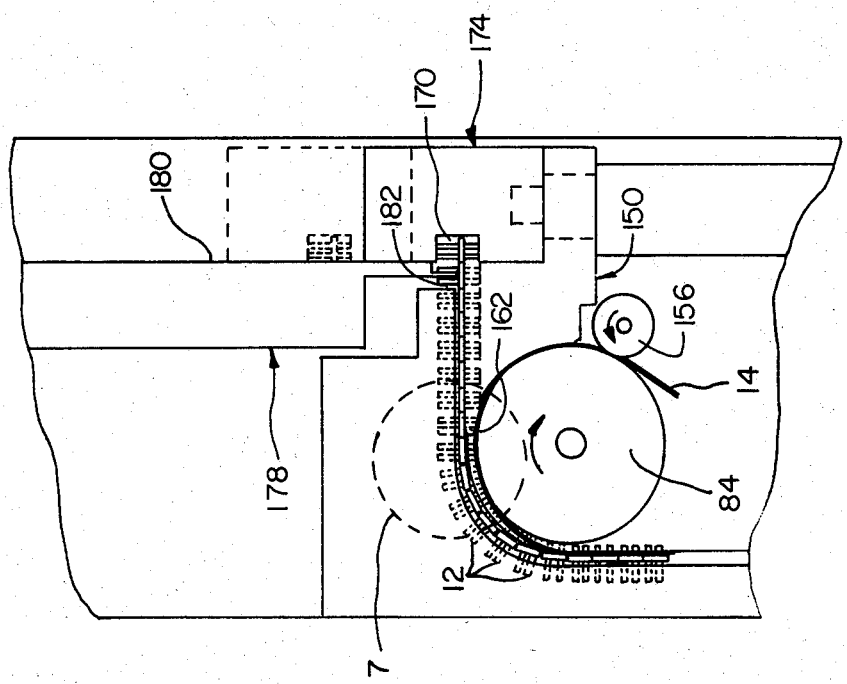
FIG. 6 is an elevational cross sectional view of a dispensing station according to the present invention.
Figure 7:
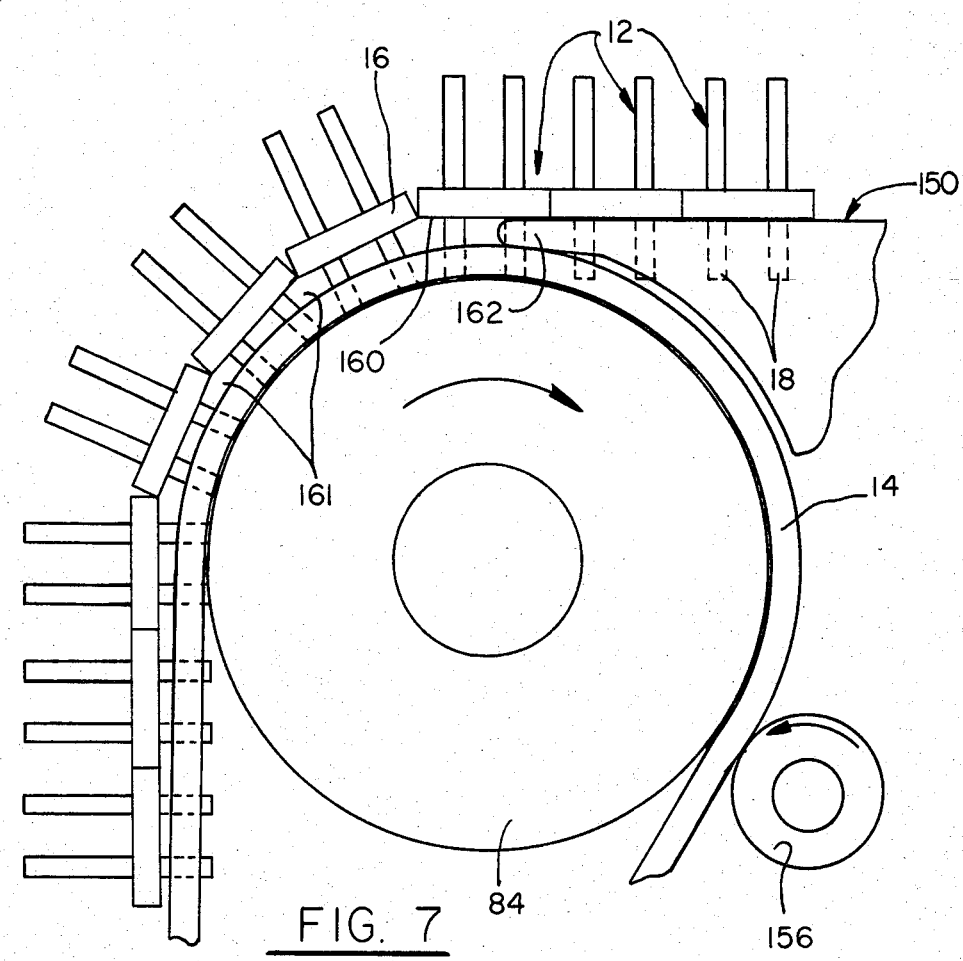
FIG. 7 is a partial view of the dispensing station of FIG. 6, shown in greater detail.
Figure 8:
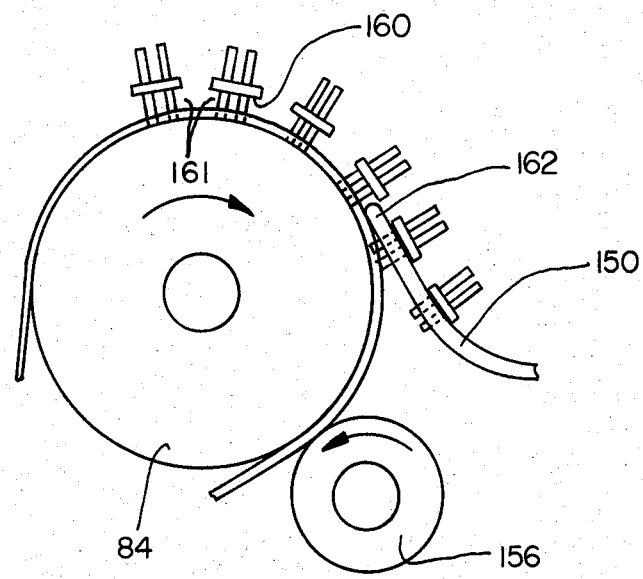
FIG. 8 is an alternative arrangement of the tape drum portion of FIG. 6.

Referring now to FIGS. 6-8, a dispensing station, similar to that of FIGS. 3 and 4, is shown with an additional array of finger-like lifter members 150 positioned immediately adjacent the connectors being withdrawn from the sheet material 14. As mentioned above, connectors 12 include a housing 16 having a plurality of spaced-apart conductive pins 18 which form a predetermined array with respect to housing 16, and which is aligned transversely on sheet material 14.

The dispensing station includes a friction-type drive wheel 156, displaced about 135 degrees from lifter members 150, which pinches sheet material 14 against the surface of roller 84. As drive wheel 156 engages the sheet material 14, it applies a tension to upstream portions of the sheet material, particularly those portions contacting the surface of roller 84. As sheet material 14 is advanced, the lowermost ends of the conductive pins 18 engage the surface of roller 84, and the tension applied to sheet material 14 pulls the material radially inwardly, over the conductive pins 18 thereby introducing a gap 161 between the upper surface of the sheet material 14 and the lower surface 160 of housing 16.

Further advancement of sheet material 14 introduces the free end 162 of lifter members 150 into gap 161, causing a wedging action with progressively wider portions of lifter members 150 being forced between the upper surface of sheet material 14 and the lower surface 160 of housing 16, thereby effecting a complete removal of housings 12 from sheet material 14. Once loaded onto lifter members 150, connectors 12 can be transferred to a loading station where they are accurately fixed in three dimensional space, for ready pickup by a robotic gripper mechanism. The arrangement of this embodiment provides a more accurate positioning of connectors 12, ultimately resulting in a more accurate positioning of those connectors on a printed circuit board by a robotic insertion head.

As will become apparent to those skilled in the art, the free ends 162 of lifter members 150 can be positioned at any point about roller 84. If set lower, (see FIG. 8) the lifter members can take advantage of a gravity feed which causes the housings 16 to slide along the upper surface of the lifter members. Alternatively, the lifer members can be positioned adjacent the upper portions of roller 84, and one of the many available positive feed arrangements known in the art can be employed to transfer connectors 12 to a remote robotic positioning station.

In the preferred embodiment of FIGS. 6 and 7, the last connector being stacked on lifter members 150 provides a longitudinal pushing force along those members, owing to the continued engagement of sheet material 14 with the conductive pins 18 during the initial sliding engagement of housing 16 with the lifter members. As can be seen in FIG. 7, the sheet material 14 continues to engage the conductive pins 18 for a distance of travel along lifter members 150 equal to at least the width of two housings 16. This ensures adequate driving force for the stack of connectors 12 riding along lifter members 150. Thus, no auxiliary feed arrangements for conveying connectors 12 along lifters members 150 need be provided.

It is not necessary that lifter members 150 be movably mounted for advancement toward connectors 12. In the preferred embodiment, the lifter members 150 are held stationary, with sheet material 14 engaging the lower most ends of pins 18, thereby providing the translational force necessary to advance connectors 12 along lifter members 150. In this latter arrangement, the positioning of lifter members 150 is arranged relative to roller 84, such that sheet material 14 continues to engage conductive pins 18 until housings 16 are advanced over the lifter member free end 162. In the preferred embodiment, members 150 were provided with a 5 degrees taper, although other amounts of taper of free ends 162, necessary to provide engagement between sheet material 14 and conductive pins 18, are possible.

Referring again to FIG. 6, connectors 12 are stacked along lifter members 150 until the first connector unloaded is received in a pocket 170 of an elevator member 174. At that point, electronic sensors indicating the presence of a connector 12 in pocket 170 operate to de-energize drive wheel 156 through either a clutch arrangement, or by terminating the power feed to the motor driving wheel 156, to bring sheet material 14 to a rest, and to relieve any compressive forces on the stack of connectors 12 which are presently loaded on lifter members 150.

The same signal that senses the presence of connector 12 in pocket 170 initiates the lowering of arm-like member 178 which both holds down the adjacent connector 12, and provides a vertical guide surface 180. Member 178 has downwardly facing extensions 182 which are inserted between conductive pins 18 to contact the upper surface of housing 16 to prevent damage or misalignment of pins 18 as the connector is held in place.

The need for hold down member 178 will now become apparent, in that fictional forces may exist between adjacent connectors 12 with the end most connector being raised to a vertical position. The left hand surface of elevator 174, as shown in FIG. 12, rides along guide surface 180 which provides further alignment for the elevator. Thereafter, elevator 174 is raised to an upper position, thereby transporting connectors 12 to a higher level, for further transport and delivery to a connector insertion station. Elevator 174 may not be required in all applications, and if so, a less expensive connector dispensing arrangement can be provided wherein lifter members 150 are mated with an inexpensive conveying truck for remote disposition of connectors 12 at a lower insertion station.

We claim:

1. In an apparatus for sequentially disposing a plurality of solid members, one at a time, at a predetermined disposition relative to a work station comprising a substrate assembly, including a plurality of solid members removeably retained in a flexible sheet material, said solid members having extending rigid projections inserted into said flexible sheet material;

a sheet material supporting means positioned adjacent said substrate assembly, said supporting means having a first solid portion disposed at said work station; and said substrate assembly disposed to overlie the sheet material supporting means to dispose a first solid member at a predetermined position on the support means; the improvement comprising:

said sheet material supporting means comprising a support roller having a solid surface for supporting said sheet substrate assembly;

means for at least partially separating said solid member from said flexible substrate to create a gap therebetween; and at least one wedge-like lifting member disposed adjacent said support roller surface and extending in the direction to said sheet material, said lifting member positioned ot lie adjacent said rigid projections, and having a free end for insertion in the gap between said sheet material and said solid members.

2. The apparatus of claim 1 wherein a plurality of lifting members is arranged adjacent said solid surface of said support roller such that said sheet material continues to engage said rigid projections after said lifting members are inserted betwen said sheet material and said solid members, to provide a pushing force for solid members along said lifting members.

3. The apparatus of claim 2 wherein said plurality of lifting members is positioned adjacent a predetermined portion of said solid roller surface such that, when said apparatus is placed in a gravitational field, said solid members slide along said lifting members under a graviational force, upon release of said rigid projections from said sheet material.

* * * * *